United States Patent
Kirby et al.

(10) Patent No.: US 9,780,285 B1
(45) Date of Patent: Oct. 3, 2017

(54) SUPERCONDUCTOR DEVICE INTERCONNECT STRUCTURE

(71) Applicants: Christopher F. Kirby, Gambrills, MD (US); Michael Rennie, Mechanicsville, VA (US); Daniel J. O'Donnell, Manassas, MD (US)

(72) Inventors: Christopher F. Kirby, Gambrills, MD (US); Michael Rennie, Mechanicsville, VA (US); Daniel J. O'Donnell, Manassas, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 169 days.

(21) Appl. No.: 15/238,375

(22) Filed: Aug. 16, 2016

(51) Int. Cl.
*H01L 29/06* (2006.01)
*H01L 29/08* (2006.01)
*H01L 39/22* (2006.01)
*H01L 39/02* (2006.01)
*H01L 39/24* (2006.01)

(52) U.S. Cl.
CPC .......... *H01L 39/223* (2013.01); *H01L 39/025* (2013.01); *H01L 39/2406* (2013.01); *H01L 39/2493* (2013.01)

(58) Field of Classification Search
CPC ............... H01L 39/223; H01L 39/2406; H01L 39/2493; H01L 39/025
See application file for complete search history.

(56) References Cited

U.S. PATENT DOCUMENTS

| | | | | |
|---|---|---|---|---|
| 5,338,934 A | * | 8/1994 | Morohashi | H01L 39/2493 250/336.2 |
| 5,897,367 A | * | 4/1999 | Kerber | H01L 27/18 257/30 |
| 9,455,391 B1 | * | 9/2016 | Nayfeh | G06N 99/002 |
| 2004/0155237 A1 | * | 8/2004 | Kerber | H01L 39/2493 257/31 |
| 2009/0057652 A1 | * | 3/2009 | Nevirkovets | B82Y 10/00 257/35 |

(Continued)

OTHER PUBLICATIONS

Tolpygo, Sergey K., et al. "Process-Induced Variability of Nb/AlOx/Nb Junctions in Superconductor Integrated Circuits and Protection Against It" *IEEE on applied superconductivity*, vol. 19, No. 3, Jun. 2009: 135-139.

(Continued)

*Primary Examiner* — Victor A Mandala
(74) *Attorney, Agent, or Firm* — Tarolli, Sundheim, Covell & Tummino LLP

(57) ABSTRACT

A method is provided of forming a superconductor device interconnect structure. The method includes forming a first dielectric layer overlying a substrate, and forming a base electrode in the first dielectric layer with the base electrode having a top surface aligned with the top surface of the first dielectric layer. The method further comprises forming a Josephson junction (JJ) over the base electrode, depositing a second dielectric layer over the JJ, the base electrode and the first dielectric layer, and forming a first contact through the second dielectric layer to the base electrode to electrically couple the first contact to a first end of the JJ, and a second contact through the second dielectric layer to a second end of the JJ.

20 Claims, 7 Drawing Sheets

(56) References Cited

U.S. PATENT DOCUMENTS

| | | | |
|---|---|---|---|
| 2013/0122722 A1* | 5/2013 | Cissell | H01L 21/02189 |
| | | | 438/784 |
| 2015/0236235 A1* | 8/2015 | Ladizinsky | H01L 39/223 |
| | | | 505/190 |
| 2016/0211438 A1* | 7/2016 | Chang | H01L 39/2493 |

OTHER PUBLICATIONS

Kerber, George L., et al. "Fabrication of high current density Nb integrated circuits using a sell-aligned junction anodization process." *IEEE transactions on applied superconductivity* 13.2 (2003): 82-86.

Abelson, Lynn A., and George L. Kerber. "Superconductor integrated circuit fabrication technology." *Proceedings of the IEEE* 92.10 (2004): 1517-1533.

\* cited by examiner

SUPERCONDUCTOR DEVICE INTERCONNECT STRUCTURE

TECHNICAL FIELD

The present invention relates generally to superconductors, and more particularly to a superconductor device interconnect structure.

BACKGROUND

Superconducting circuits are one of the leading technologies proposed for quantum computing and cryptography applications that are expected to provide significant enhancements to national security applications where communication signal integrity or computing power are needed. They are operated at temperatures <100 kelvin. Efforts on fabrication of superconducting devices have mostly been confined to university or government research labs, with little published on the mass producing of superconducting devices. Therefore, many of the methods used to fabricate superconducting devices in these laboratories utilize processes or equipment incapable of rapid, consistent fabrication. Furthermore, the need for low temperature processing currently presents one of the more significant barriers to mass production of superconducting devices.

One of the common devices employed in superconducting circuits is a Josephson junction (JJ). Today's typical Josephson junctions (JJs) are formed using a self-aligned anodization process which uses a highly corrosive electrochemical bath to form a protective thick passivation layer around the JJ in the form of a large ring. This thick ring of oxidized superconducting material forms the insulation between the active part of the JJ and the top electrode wiring. Furthermore, the use of legacy processing techniques to form a JJ result in large topography problems and therefore problems with yield and reliability of the JJ. The use of anodization process results in a relatively large JJ area due to the need to mask and etch off the blanket anodization layer away from the JJ ring. Both of these processes lead to a minimum size of JJ of the order of 1 um diameter which limits the density and functionality of an integrated chip.

SUMMARY

In one example, a method is provided of forming a superconductor device interconnect structure. The method comprises forming a first dielectric layer overlying a substrate, and forming a base electrode in the first dielectric layer with the base electrode having a top surface aligned with the top surface of the first dielectric layer. The method further comprises forming a Josephson junction (JJ) over the base electrode, depositing a second dielectric over the JJ, the base electrode and the first dielectric layer, and forming a first contact through the second dielectric layer to the base electrode to electrically couple the first contact to a first end of the JJ, and a second contact through the second dielectric to a second end of the JJ.

In yet another example, a method is provided for forming a superconductor device interconnect structure. The method comprises forming a first dielectric layer overlying a substrate, forming a niobium base electrode in the first dielectric layer where the niobium base electrode has a top surface aligned with the top surface of the first dielectric layer, depositing an aluminum layer over the base electrode and the first dielectric layer, and oxidizing the aluminum layer to form an aluminum oxide layer on the top surface of the aluminum layer. The method further comprises forming a niobium layer over the aluminum oxide layer, depositing and patterning a photoresist material layer over the niobium layer to define dimensions of the JJ, and etching the niobium layer, the aluminum oxide layer and the aluminum layer to form a JJ based on the defined dimensions, and thus removing the remaining portions of the niobium layer, the aluminum oxide layer and the aluminum layer. The method further comprises stripping the photoresist material layer, depositing a second dielectric over the JJ, the base electrode and the first dielectric layer, forming a first contact through the second dielectric layer to the base electrode to electrically couple the first contact to a first end of the JJ, and a second contact through the second dielectric to a second end of the JJ, and forming a first conductive line overlying the first contact and second conductive line overlying the second contact, wherein the first and second conductive lines have a top surface that is aligned with a top surface of the second dielectric layer.

In another example, a superconductor device interconnect structure is provided. The structure comprises a first dielectric layer overlying a substrate, a niobium base electrode disposed in the first dielectric layer and having a top surface aligned with the top surface of the first dielectric layer, and a JJ disposed over and in contact with the base electrode. The method further comprises a second dielectric layer that overlays the JJ, the base electrode and the first dielectric layer, a first contact that extends through the second dielectric layer from a top surface of the second dielectric layer to the base electrode to electrically couple the first contact to a first end of the JJ, and a second contact that extends through the second dielectric to a second end of the JJ.

DETAILED DESCRIPTION

The present invention is directed to a superconductor device (e.g., Josephson junction (JJ)) interconnect structure and a method for forming the same. The method incorporates a scalable JJ process into a planarized superconducting interconnect and dielectric. Specifically, the method integrates a niobium based superconducting JJ (e.g., Nb/Al/AlOx/Nb) into a dual damascene process for scaling into a high density multilevel interconnect submicron technology. The method employs a dual damascene formation of a superconducting material as a base electrode coupled to a first end of a JJ along with a counter-electrode that extends to a dielectric surface, and thereby lends itself into a multi-layer interconnect scheme for high density wiring. Also the active junction area is formed on top of an underlying superconducting trace and requires no extra insulating layer. A top electrode is connected to a second end of the JJ using a via (contact) which is smaller than the junction diameter and therefore increases JJ density.

Figure 1:
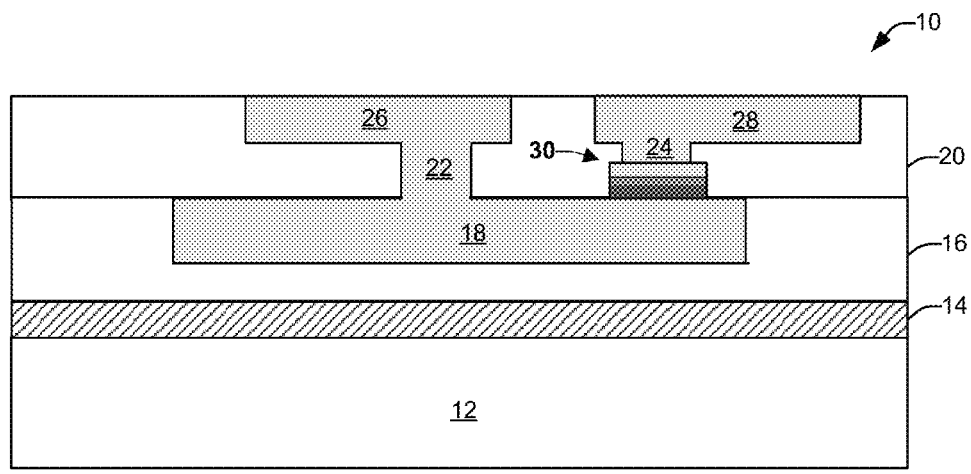
FIG. 1 illustrates cross-sectional view of a superconducting device interconnect structure.

FIG. 1 illustrates cross-sectional view of a superconducting device JJ interconnect structure 10. The superconducting device structure 10 includes an active layer 14 overlying a substrate 12. The substrate 12 can be formed of silicon, glass or other substrate material. The active layer 14 can be a ground layer or a device layer. A first dielectric layer 16 overlies the active layer 14, and a second dielectric layer 20 overlies the first dielectric layer 16. Both the first and the second dielectric layers are formed of a low temperature dielectric material that can be employed in low temperatures (e.g., less than or equal to 160 degrees Celsius) typically utilized in the formation of JJs.

A base electrode 18 is embedded in the first dielectric layer. A JJ 30 is disposed over the base electrode 18 near a first end of the base electrode 18 and is embedded in the second dielectric layer 20. A thin aluminum layer with an oxidized top surface and capped with a niobium layer forms a trilayer stack along with the base electrode 18 to form the JJ 30. A first conductive contact 22 extends from the base electrode 18 at a second end to a counter electrode that is formed from a first conductive line 26, such that the counter electrode is electrically coupled to a first end of the JJ 30. A second conductive contact 24 extends from a second end of the JJ 30 to a top electrode formed from a second conductive line 28. The second conductive contact 24 is smaller than the junction diameter and therefore increases JJ density. Each of the contacts and conductive lines are formed of a superconducting material, such as niobium.

Turning now to FIGS. 2-10, fabrication is discussed in connection with formation of interconnects in the superconducting device of FIG. 1. It is to be appreciated that the present example is discussed with respect to a process flow that starts with the formation of either a single or dual damascene layer of superconducting metal in an insulating dielectric. If the JJ is formed first then it would be a single damascene as depicted below or dual damascene if inserted within a multi-level interconnect. The present example will be illustrated with respect to a single damascene trench etched into a dielectric thin film to form a bottom electrode followed by a dual damascene process to form a top electrode.

Figure 2:
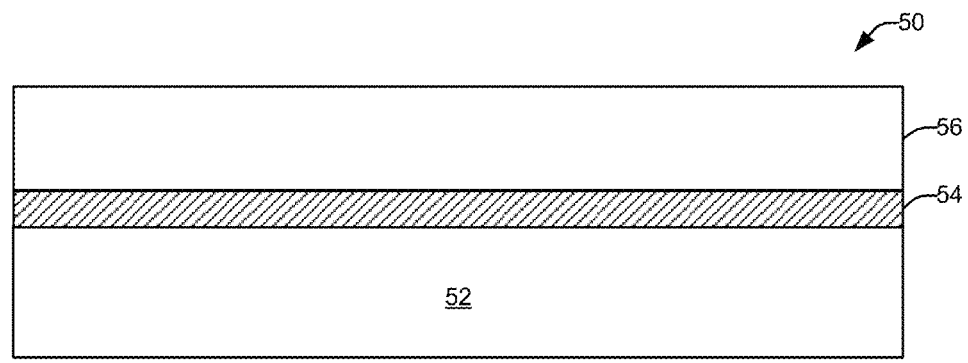
FIG. 2 illustrates a schematic cross-sectional view of an example of a superconductor structure in its early stages of fabrication.

FIG. 2 illustrates a superconductor structure 50 in its early stages of fabrication. The superconductor structure 50 includes an active layer 54, such as a ground layer or device layer, that overlays an underlying substrate 52. The underlying substrate 52 can be, for example, a silicon or glass wafer that provides mechanical support for the active layer 54 and subsequent overlying layers. A first dielectric layer 56 is formed over the active layer 54. Any suitable technique for forming the first dielectric layer 56 may be employed such as Low Pressure Chemical Vapor Deposition (LP-CVD), Plasma Enhanced Chemical Vapor Deposition (PECVD), High Density Chemical Plasma Vapor Deposition (HDPCVD), sputtering or spin on techniques to a thickness suitable for providing an interconnect layer. Alternatively, the first dielectric layer 56 can be formed directly on the substrate 50.

Figure 3:
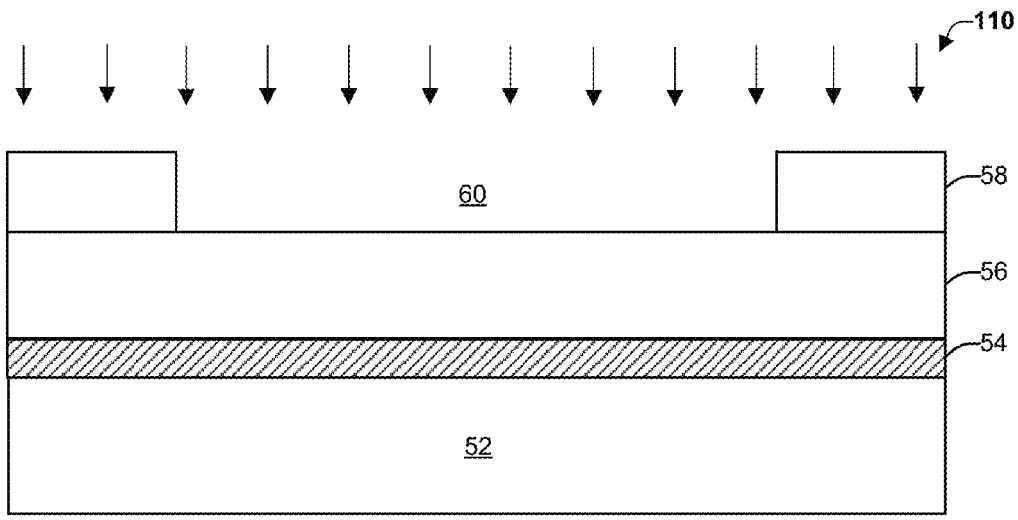
FIG. 3 illustrates a schematic cross-sectional view of the structure of FIG. 2 after a photoresist material layer has been deposited and patterned, and while undergoing an etch process.
Figure 4:
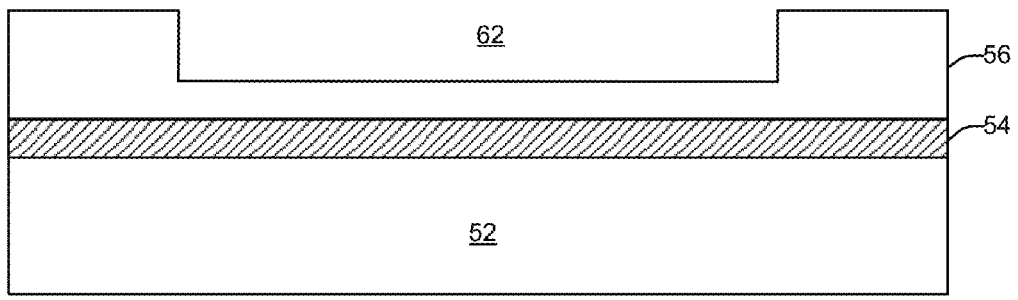
FIG. 4 illustrates a schematic cross-sectional view of the structure of FIG. 3 after the etch process and after the photoresist material layer has been stripped.

Next, as illustrated in FIG. 3, a photoresist material layer 58 is applied to cover the structure and is then patterned and developed to expose a trench opening 60 in the photoresist material layer 58 in accordance with a trench pattern. The photoresist material layer 58 can have a thickness that varies in correspondence with the wavelength of radiation used to pattern the photoresist material layer 58. The photoresist material layer 58 may be formed over the dielectric layer 56 via spin-coating or spin casting deposition techniques, selectively irradiated (e.g., via deep ultraviolet (DUV) irradiation) and developed to form the trench opening 60.

FIG. 3 also illustrates performing of an etch 110 (e.g., anisotropic reactive ion etching (RIE)) on the dielectric layer 56 to form an extended trench openings 62 (FIG. 4) in the dielectric layer 56 based on the trench pattern in the photoresist material layer 58. The etch step 110 can be a dry etch and employ an etchant which selectively etches the underlying dielectric layer 56 at a faster rate than the underlying active layer 54 and the overlying photoresist material layer 58. For example, the first dielectric layer 56 may be anisotropically etched with a plasma gas(es), herein carbon tetrafluoride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 58 to thereby create the extended trench opening 62. The photoresist material layer 58 is thereafter stripped (e.g., ashing in an $O_2$ plasma) so as to result in the structure shown in FIG. 4.

Figure 5:
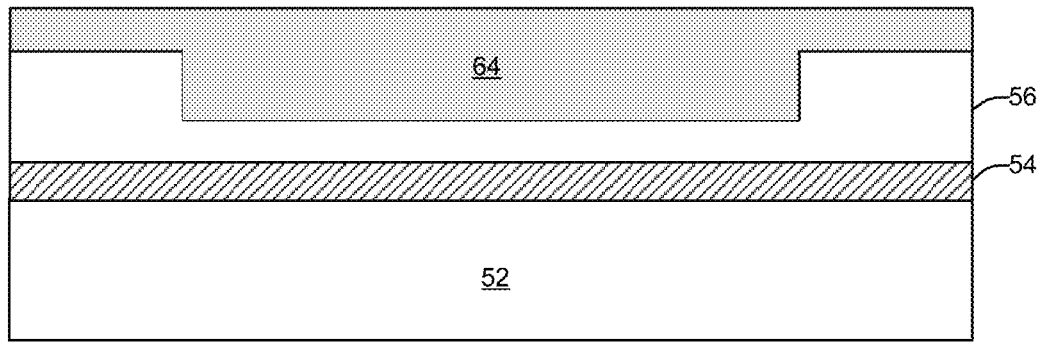
FIG. 5 illustrates a schematic cross-sectional view of the structure of FIG. 4 after a contact material fill.

Next, the structure undergoes a contact material fill to deposit a superconducting material 64, such as niobium, into the trench 62 to form the resultant structure of FIG. 5. The contact material fill can be deposited employing a standard contact material deposition. Following deposition of the contact material fill, the superconducting material 64 is polished via chemical mechanical polishing (CMP) down to the surface level of the dielectric layer 56 to form the base electrode 66 and provide the resultant structure of FIG. 6.

Figure 6:
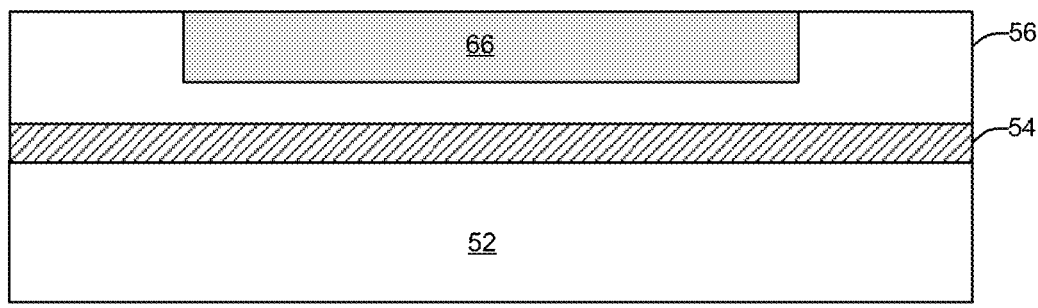
FIG. 6 illustrates a schematic cross-sectional view of the structure of FIG. 5 after undergoing a chemical mechanical polish.
Figure 7:
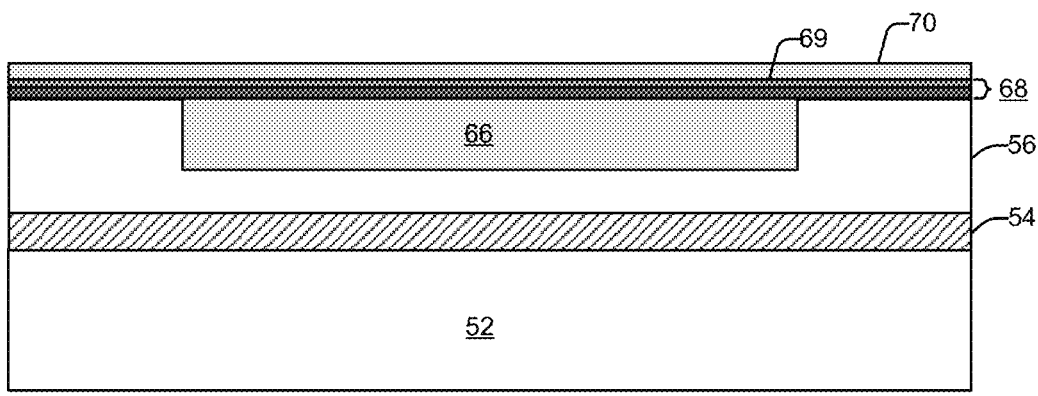
FIG. 7 illustrates a schematic cross-sectional view of the structure of FIG. 6 after undergoing formation of a trilayer.
Figure 8:
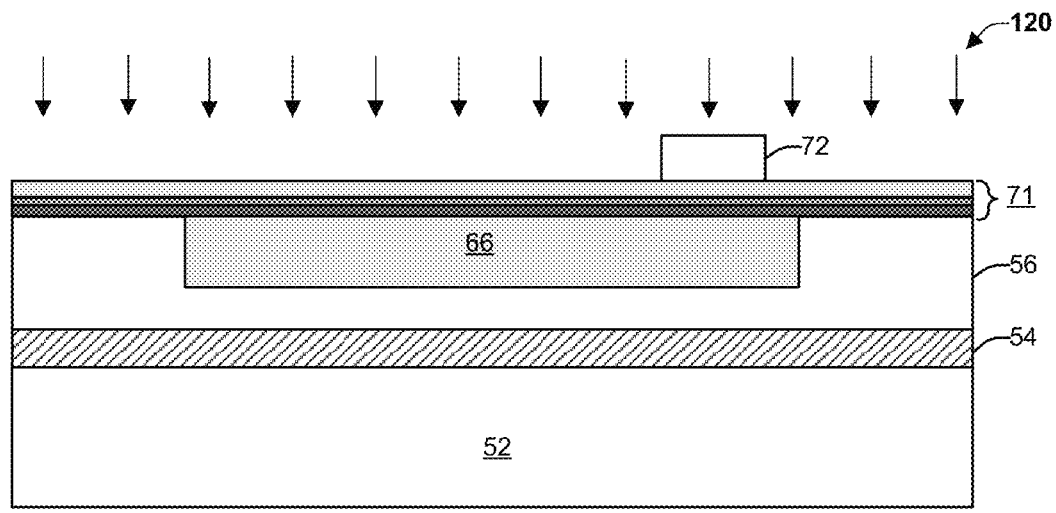
FIG. 8 illustrates a schematic cross-sectional view of the structure of FIG. 7 after a photoresist material layer has been deposited and patterned, and while undergoing an etch process.

Next junction materials are deposited over the polished surface of the structure of FIG. 6. In the example of FIG. 7, a thin aluminum layer 68 is deposited, oxidized to form an oxidized top surface 69 and capped with a niobium layer 70 to form a trilayer stack 71. The thin oxidized aluminum forms the tunnel barrier and the niobium proximity effect sets the gap voltage which both affects the critical current of the JJ. The JJ is defined using Deep Ultraviolet (DUV) photolithography patterning over the trilayer stack 71. As illustrated in FIG. 8, a photoresist material layer 72 is applied to cover a portion of the structure and is then patterned and developed to expose the trilayer stack everywhere except where the JJ is going to be formed.

FIG. 8 also illustrates performing of an etch 120 (e.g., anisotropic reactive ion etching (RIE)) on the trilayer stack material 71 to form a JJ 74 (FIG. 9) overlying the base electrode 66 to define the final JJ size. The etch step 120 can be a dry etch that employs an etchant which selectively etches the trilayer stack layer 71 at a faster rate than the underlying base electrode 66 and the overlying photoresist material layer 72. A chlorine based plasma etch is utilized as the etchant since it will etch superconducting materials, such as niobium and aluminum. The aluminum oxide is so thin that etching does not stop due to the presence of argon in the etching chemistry. The plasma etch is desired to not over-etch significantly into the underlying base electrode 66, which is benefited by the good planarity of the underlying structure to thereby create the JJ 74. The photoresist material layer 72 is thereafter stripped (e.g., ashing in an $O_2$ plasma) so as to result in the structure shown in FIG. 9.

Figure 9:
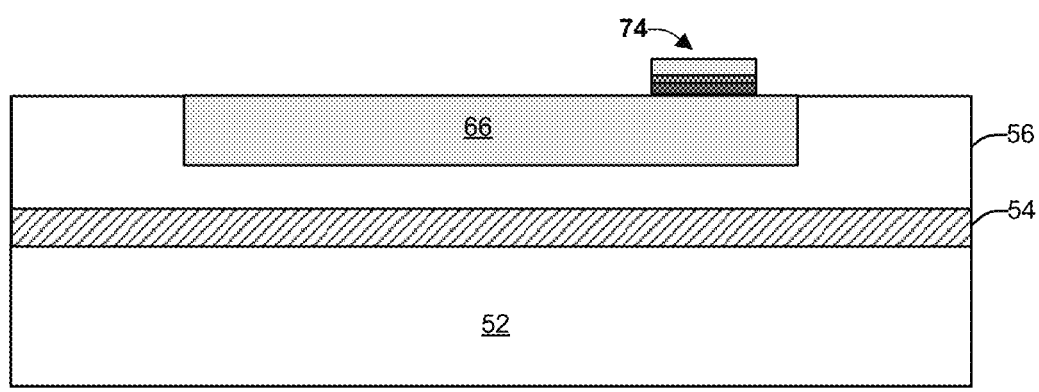
FIG. 9 illustrates a schematic cross-sectional view of the structure of FIG. 8 after the etch process and after the photoresist material layer has been stripped.
Figure 10:
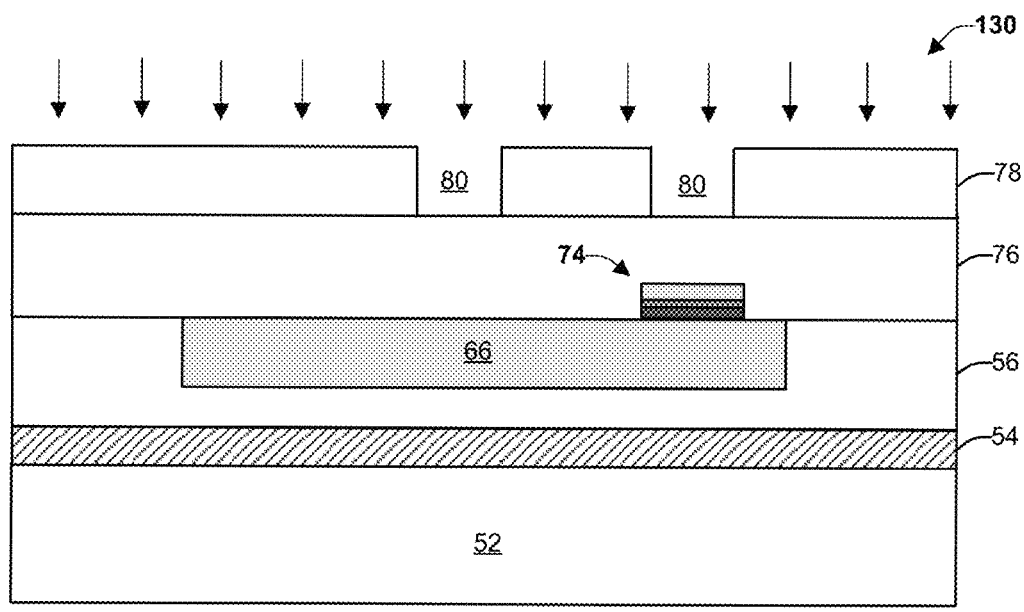
FIG. 10 illustrates a schematic cross-sectional view of the structure of FIG. 9 after undergoing deposition of a second dielectric layer, after a photoresist material layer has been deposited and patterned, and while undergoing an etch process.
Figure 11:
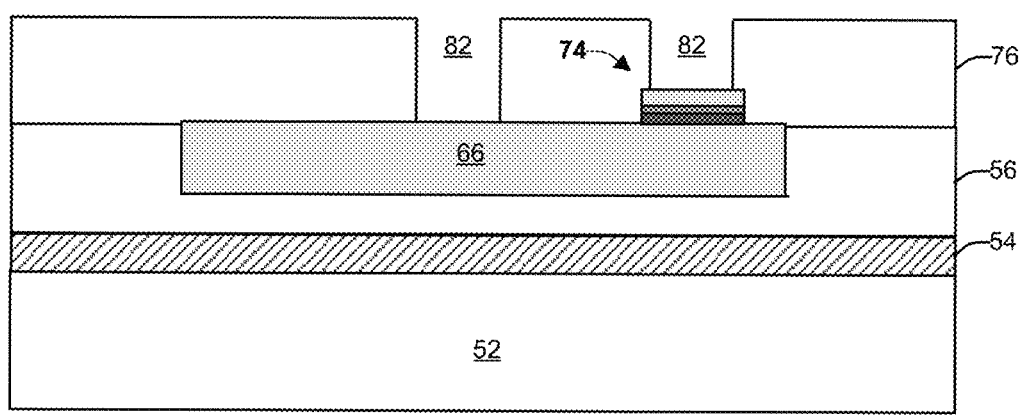
FIG. 11 illustrates a schematic cross-sectional view of the structure of FIG. 10 after the etch process and after the photoresist material layer has been stripped.

Next, as represented in FIG. 10, a second dielectric layer 76 is formed over the structure of FIG. 9 to encapsulate the JJ 74. A photoresist material layer 78 is applied to cover the structure and is then patterned (e.g., DUV imaged) and developed to expose open regions 80 in the photoresist material layer 78 in accordance with a via pattern. FIG. 10 also illustrates performing of an etch 130 on the second dielectric layer 76 to form extended via openings 82 (FIG. 11) in the second dielectric layer 76 based on the via pattern in the photoresist material layer 78. The etch 130 uses an etchant that has a selective chemistry to niobium. A first extended open region extends to the base electrode 66 and a second extended open region extends to the JJ 74 to provide connections to the base electrode 66 and the JJ 74. The photoresist material layer 76 is thereafter stripped (e.g., ashing in an $O_2$ plasma) so as to result in the structure shown in FIG. 11.

Figure 12:
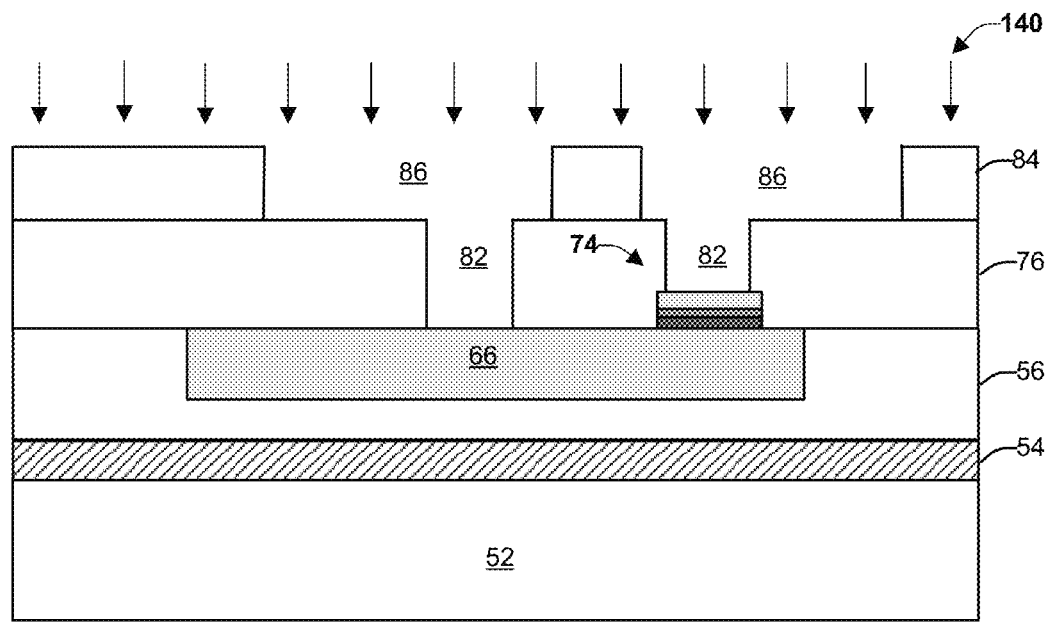
FIG. 12 illustrates a schematic cross-sectional view of the structure of FIG. 11 after a photoresist material layer has been deposited and patterned, and while undergoing an etch process.
Figure 13:
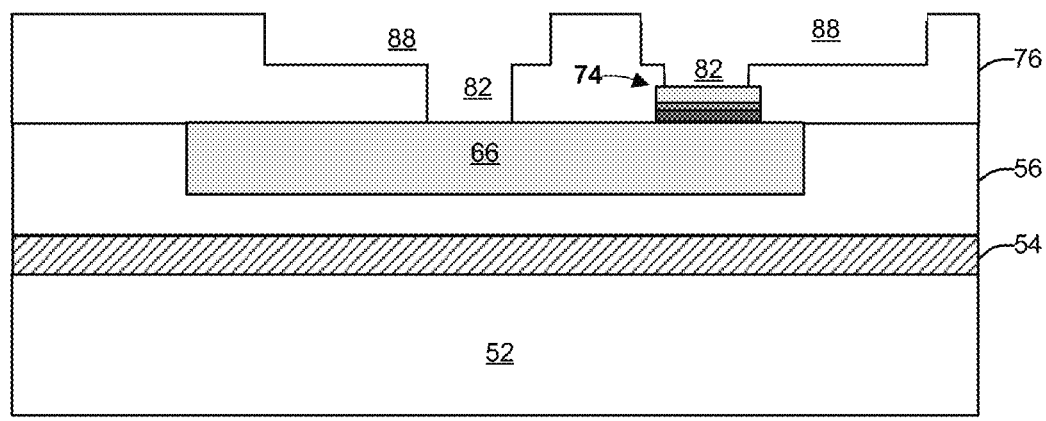
FIG. 13 illustrates a schematic cross-sectional view of the structure of FIG. 12 after the etch process and after the photoresist material layer has been stripped.

Next, as represented in FIG. 12, a photoresist material layer 84 is applied to cover the structure and is then patterned and developed to expose open trench regions 86 in the photoresist material layer 84 in accordance with a trench pattern. FIG. 12 also illustrates performing of an etch 140 (e.g., anisotropic reactive ion etching (RIE)) on the second dielectric layer 76 to form extended openings 88 (FIG. 12) in the second dielectric layer 76 based on the trench pattern in the photoresist material layer 84. The photoresist material layer 84 is thereafter stripped (e.g., ashing in an $O_2$ plasma) so as to result in the structure shown in FIG. 13.

Figure 14:
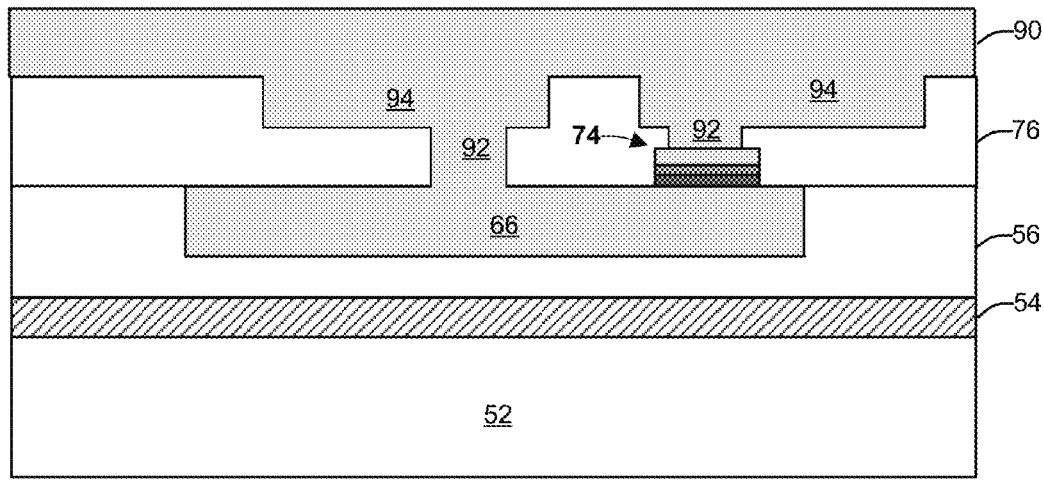
FIG. 14 illustrates a schematic cross-sectional view of the structure of FIG. 13 after a contact material fill.
Figure 15:
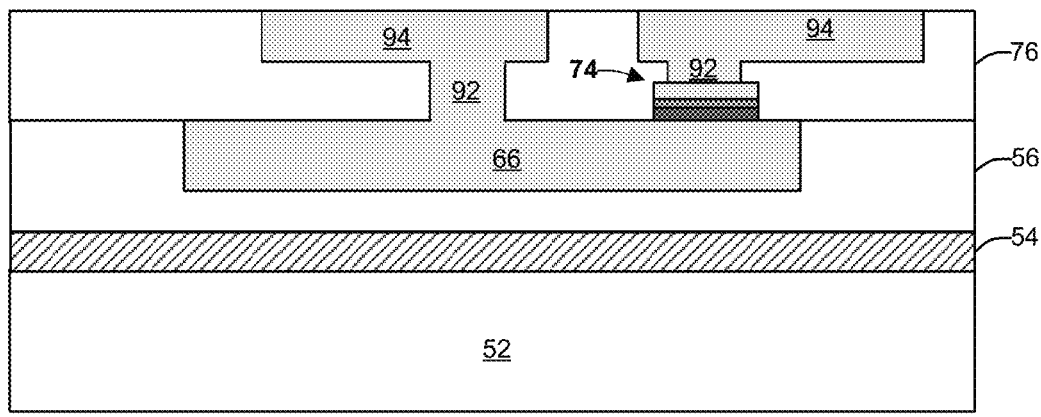
FIG. 15 illustrates a schematic cross-sectional view of the structure of FIG. 14 after undergoing a chemical mechanical polish.

Next, the structure undergoes a contact material fill to deposit superconducting material 90, such as niobium, into the vias 82 and trenches 88 employing a standard contact material deposition to provide the resultant structure in FIG. 14. Following deposition of the contact material fill, the contact material is polished via chemical mechanical polishing (CMP) down to the surface level of the second non-oxide base dielectric layer 76 to provide the resultant structure in FIG. 15. A resultant final structure is provided that includes contacts that extend to the base electrode 66 and the JJ 74 coupled to respective conductive lines 94 to provide a structure similar to the structure illustrated in FIG. 1. The conductive lines 94 form a counter electrode coupled to a base electrode which is coupled to a first end of the JJ 74 with a top electrode coupled to a second end of the JJ 74.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A method of forming a superconductor device interconnect structure, the method comprising:
   forming a first dielectric layer overlying a substrate;
   forming a base electrode in the first dielectric layer, the base electrode having a top surface aligned with the top surface of the first dielectric layer;
   forming a Josephson junction (JJ) over the base electrode;
   depositing a second dielectric over the JJ, the base electrode and the first dielectric layer; and
   forming a first contact through the second dielectric layer to the base electrode to electrically couple the first contact to a first end of the JJ, and a second contact through the second dielectric layer to a second end of the JJ.

2. The method of claim 1, wherein the JJ is formed from an Aluminum/Aluminum oxide layer disposed between the base electrode and a niobium layer.

3. The method of claim 2, wherein the base electrode is formed from niobium.

4. The method of claim 1, wherein the second contact has a diameter that is smaller than the diameter of the JJ.

5. The method of claim 1, wherein the dielectric material employed in the first dielectric layer and the second dielectric layer is a material that can form the dielectric first and second material layers at a temperature of about 160° Celsius.

6. The method of claim 1, further comprising forming a first conductive line overlying the first contact and second conductive line overlying the second contact, wherein the first and second conductive lines have a top surface that is aligned with a top surface of the second dielectric layer.

7. The method of claim 6, wherein the first and second contacts and the first and second conductive lines are formed by a dual damascene process.

8. The method of claim 1, wherein the base electrode is formed by a single damascene process.

9. The method of claim 1, wherein the formation of the JJ comprises:
   depositing an aluminum layer over the base electrode and the first dielectric layer;
   oxidizing the aluminum layer to form an aluminum oxide layer on the top surface of the aluminum layer;
   forming a niobium layer over the aluminum oxide layer;
   depositing and patterning a photoresist material layer over the niobium layer to define dimensions of the Josephson junction;
   etching the niobium layer, the aluminum oxide layer and the aluminum layer to form a JJ and remove the remaining portions of the niobium layer, the aluminum oxide layer and the aluminum layer; and
   stripping the photoresist material layer.

10. The method of claim 1, further comprising forming one or more layers between the substrate and the first dielectric layer.

11. A method of forming a superconductor device interconnect structure, the method comprising:
- forming a first dielectric layer overlying a substrate;
- forming a niobium base electrode in the first dielectric layer, the niobium base electrode having a top surface aligned with the top surface of the first dielectric layer;
- depositing an aluminum layer over the base electrode and the first dielectric layer;
- oxidizing the aluminum layer to form an aluminum oxide layer on the top surface of the aluminum layer;
- forming a niobium layer over the aluminum oxide layer;
- depositing and patterning a photoresist material layer over the niobium layer to define dimensions of the Josephson junction (JJ);
- etching the niobium layer, the aluminum oxide layer and the aluminum layer to form a JJ based on the defined dimensions and removing the remaining portions of the niobium layer, the aluminum oxide layer and the aluminum layer;
- stripping the photoresist material layer;
- depositing a second dielectric layer over the JJ, the base electrode and the first dielectric layer;
- forming a first contact through the second dielectric layer to the base electrode to electrically couple the first contact to a first end of the JJ, and a second contact through the second dielectric to a second end of the JJ; and
- forming a first conductive line overlying the first contact and second conductive line overlying the second contact, wherein the first and second conductive lines have a top surface that is aligned with a top surface of the second dielectric layer.

12. The method of claim 11, wherein the second contact has a diameter that is smaller than the diameter of the JJ.

13. The method of claim 11, wherein the dielectric material employed in the first dielectric layer and the second dielectric layer is a material that can form the dielectric first and second material layers at a temperature of about 160° Celsius.

14. The method of claim 11, wherein the first and second contacts and the first and second conductive lines are formed by a dual damascene process.

15. The method of claim 11, wherein the base electrode is formed by a single damascene process.

16. A superconductor device interconnect structure comprising:
- a first dielectric layer overlying a substrate;
- a niobium base electrode disposed in the first dielectric layer, the niobium base electrode having a top surface aligned with the top surface of the first dielectric layer;
- a Josephson junction (JJ) disposed over and in contact with the base electrode;
- a second dielectric that overlays the JJ, the base electrode and the first dielectric layer;
- a first contact that extends through the second dielectric layer from a top surface of the second dielectric layer to the base electrode to electrically couple the first contact to a first end of the JJ; and
- a second contact that extends through the second dielectric layer to a second end of the JJ.

17. The structure of claim 16, wherein the JJ is formed from an Aluminum/Aluminum oxide layer disposed between the base electrode and a niobium layer.

18. The structure of claim 16, wherein the second contact has a diameter that is smaller than the diameter of the JJ.

19. The structure of claim 16, wherein the dielectric material employed in the first dielectric layer and the second dielectric layer is a material that can form the dielectric first and second layers at a temperature of about 160° Celsius.

20. The structure of claim 16, further a first conductive line overlying the first contact and a second conductive line overlying the second contact, wherein the first and second conductive lines have a top surface that is aligned with a top surface of the second dielectric layer.

* * * * *